(12) United States Patent
Jou et al.

(10) Patent No.: US 8,569,793 B2
(45) Date of Patent: Oct. 29, 2013

(54) ORGANIC LIGHT-EMITTING DIODE WITH HIGH COLOR RENDERING

(75) Inventors: Jwo-Huei Jou, Hsinchu (TW); Yi-Chieh Chou, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 299 days.

(21) Appl. No.: 12/797,329

(22) Filed: Jun. 9, 2010

(65) Prior Publication Data
US 2011/0240963 A1  Oct. 6, 2011

(30) Foreign Application Priority Data

Apr. 1, 2010  (TW) .............................. 99110087 A

(51) Int. Cl.
*H01L 51/00*  (2006.01)

(52) U.S. Cl.
USPC ...................... 257/103; 257/40; 257/E51.022

(58) Field of Classification Search
None
See application file for complete search history.

(56) References Cited

U.S. PATENT DOCUMENTS

| | | | |
|---|---|---|---|
| 7,919,783 B2 * | 4/2011 | Ushikubo et al. ............... | 257/89 |
| 8,026,662 B2 * | 9/2011 | Ishihara et al. ............... | 313/504 |
| 8,067,885 B2 * | 11/2011 | Kashiwabara ............... | 313/504 |
| 8,420,228 B2 | 4/2013 | Park et al. | |
| 2003/0189401 A1 * | 10/2003 | Kido et al. ..................... | 313/504 |
| 2005/0134174 A1 * | 6/2005 | Shiratori et al. ............... | 313/506 |
| 2007/0129545 A1 * | 6/2007 | Inoue et al. ..................... | 544/225 |
| 2007/0241667 A1 * | 10/2007 | Ohsawa et al. ............... | 313/504 |
| 2009/0261360 A1 * | 10/2009 | Yasukawa et al. ............... | 257/89 |
| 2010/0096622 A1 | 4/2010 | Iizumi et al. | |
| 2010/0096633 A1 * | 4/2010 | Hatano et al. ................... | 257/59 |

FOREIGN PATENT DOCUMENTS

| | | |
|---|---|---|
| CN | 101055923 A | 10/2007 |
| CN | 101611505 A | 12/2009 |

* cited by examiner

*Primary Examiner* — Benjamin Sandvik
(74) *Attorney, Agent, or Firm* — Muncy, Geissler, Olds & Lowe, PLLC

(57) ABSTRACT

An organic light-emitting diode with high color rendering is provided, which comprises: a substrate with a first electrode formed thereon; a first light-emitting region disposed over the first electrode, wherein the first light-emitting region comprises at least one layer of a first light-emitting layer, and the first light-emitting layer comprises at least one first dye respectively; a spacer disposed on the first light-emitting region; a second light-emitting region disposed on the organic spacer, wherein the second light-emitting region comprises at least one layer of a second light-emitting layer, and the second light-emitting layer comprises at least one second dye respectively; and a second electrode disposed over the second light-emitting region.

13 Claims, 2 Drawing Sheets

ORGANIC LIGHT-EMITTING DIODE WITH HIGH COLOR RENDERING

BACKGROUND OF THE INVENTION

1. Field of the Invention

The present invention relates to an organic light-emitting diode and, more particularly, to an organic light-emitting diode with high color rendering.

2. Description of Related Art

Organic light-emitting diodes (OLEDs) are advantageous in having light weight, thinness (less than 1 mm), high brightness, wide viewing angle, no need for backlight, low energy consumption, short response time, high resolution, low heat emission, shock resistance, low producing cost, good flexibility etc., and therefore have drawn much attention to the research in the related fields.

Reference with FIG. 1, wherein an organic light-emitting diode is shown, which comprises: a substrate 101, an anode 102, a hole injection layer 103, a hole transport layer 104, a light-emitting layer 105, an electron transport layer 106, an electron injection layer 108, and a cathode 108, in which the light-emitting layer 105 is disposed between the hole transport layer 104 and the electron transport layer 106, and the light-emitting layer 105 is mainly used to control the combination of the electrons and the holes as well as the light-emission.

The color rendering index (CRI) or the power or current efficiency of the OLEDs can be improved with the use of the multiple organic layers and emission layers, however it is difficult to improve the color rendering index (CRI) and the power or current efficiency simultaneously in the conventional OLEDs, whereas the multiple organic layers and emission layers may result in complex process steps that may trigger high providing cost. Therefore, it is still difficult to develop an OLED having excellent color rendering index and power or current efficiency at the same time, which is able to replace the commonplace fluorescent lamp.

Therefore, it is desirable to provide an improved OLED that can be applied to illumination usage, which has high illumination efficiency and excellent color rendering index (CRI) simultaneously and is able to replace the commonplace fluorescent lamp.

SUMMARY OF THE INVENTION

The object of the present invention is to provide an organic light-emitting diode (OLED), which has a spacer and therefore can have excellent color rendering index (CRI) and high power or current efficiency simultaneously.

To achieve the object, the organic light-emitting diode (OLED) of the present invention includes: a substrate with a first electrode formed thereon; a first light-emitting region disposed over the first electrode, wherein the first light-emitting region comprises at least one layer of a first light-emitting layer, and the at least one first light-emitting layer comprises at least one first dye; a spacer disposed on the first light-emitting region; a second light-emitting region disposed on the spacer, wherein the second light-emitting region comprises at least one layer of a second light-emitting layer, and the at least one second light-emitting layer comprises at least one second dye; and a second electrode disposed over the second light-emitting region.

The OLED of the present invention utilizes a spacer disposed between the first light-emitting region and the second light-emitting region and therefore can obtain ideal power or current efficiency and excellent color rendering index (CRI). Compared with a conventional OLED having multi-organic layers and light-emitting layers, the OLED of the present invention has uncomplicated structure and can be easily produced with simple process due to the three layers of the light-emitting region.

According to the OLED of the present invention, the material of the spacer can be selected depending on the energy level (HOMO and LUMO) of the material. Preferably, the HOMO and LUMO energy levels of the spacer material locate between those of the first light-emitting region and the second light-emitting region, and therefore the combination of the holes and the electrons of the organic light-emitting layers can be well controlled to emit light and further to obtain excellent color rendering index (CRI). According to the present invention, the material of the spacer preferably has a hole mobility of $2\times10^{-3}$ to $6\times10^{-8}$ $cm^2V^{-1}S^{-1}$. With an electric field of $3.6\times10^{-5}$ $Vcm^{-1}$, the electron mobility of the material of the spacer is preferably $2\times10^{-3}$ to $6\times10^{-8}$ $cm^2V^{-1}S^{-1}$.

According to the OLED of the present invention, the material of the spacer may be a host material or a fluorescent dye, and preferably is TCTA, CBP, 4P-NPD, TPBi, $Alq_3$, or a mixture thereof.

The OLED of the present invention may optionally further comprise a hole transport layer, a hole injection layer, an electron transport layer, or an electron injection layer. If a hole transport layer or a hole injection layer is further comprised in the OLED of the present invention, the comprised hole transport layer or hole injection layer may locate between the first electrode and the first light-emitting region. If a hole transport layer and a hole injection layer are comprised in the OLED at the same time, the hole injection layer and the hole transport layer are sequentially formed on the first electrode to let the hole injection layer locate between the first electrode and the hole transport layer, and let the hole transport layer locate between the first electrode and the first light-emitting region. If an electron transport layer or an electron injection layer is further comprised in the OLED of the present invention, the comprised electron transport layer or electron injection layer may locate between the second light-emitting region and the second electrode. If an electron transport layer and an electron injection layer are comprised in the OLED at the same time, the electron transport layer and the electron injection layer are sequentially formed on the second light-emitting region to let the electron transport layer locate between the second light-emitting region and the electron injection layer, and let the electron injection layer locate between the electron transport layer and the second electrode.

According to the OLED of the present invention, the first light-emitting region may comprise one to four layers of the first light-emitting layer, and the second light-emitting region may comprise one to four layers of the second light-emitting layer.

According to the OLED of the present invention, the first and the second dyes are independently a fluorescent dye or a phosphorescence dye. When the first dye is a phosphorescence dye, the first light-emitting layer may further comprise a host material. When the first dye is a fluorescent dye, the first light-emitting layer may optionally comprise a host material. Meanwhile, when the second dye is a phosphorescence dye, the second light-emitting layer may further comprise a host material. When the second dye is a fluorescent dye, the second light-emitting layer may optionally comprise a host material. Also, the first dye may be a mixture of a fluorescent dye and a phosphorescence dye, and the first light-emitting layer may further comprise a host material simultaneously. The second dye may be a mixture of a fluorescent dye and a phosphorescence dye, and the second light-emitting layer may further comprise a host material simultaneously.

Preferably, the first dye may be a blue dye such as MDP3FL, DSB, or a mixture thereof, and the second dye may comprise a red dye and a green dye such as Ir(piq)$_2$(acac), Ir(2-phq)$_3$, and Ir(ppy)$_3$.

If the OLED of the present invention comprise plural first light-emitting layers and/or plural second light-emitting layers, each of the first light-emitting layers can be made of the same or different materials (comprising dyes and host materials), and each of the second light-emitting layers can be made of the same or different materials (comprising dyes and host materials).

Except the dyes mentioned above, the first dye and the second dye may be a generally used fluorescent dye or a phosphorescence dye, for example, organic light-emitting materials for green light emission such as BNE, Alq, DPT, Alq3, Bebq2, DMQA, Coumarin 6, Q, NMQ, and Quinacrine etc; organic light-emitting materials for red light emission such as DCM-2, TMS-SiPc, DCJTB, and ABTX etc; and organic light-emitting materials for blue light emission such as TPAN, DPAN, DPAP, Perylene (C20H12), DPVBi, PPD, α-NPD2, β-NPD, TTBND, DCTA, and TDAPTz etc.

In a preferred embodiment of the OLED of the present invention, the at least one first dye comprises MDP3FL and DSB, in which the concentration of the DSB is 0 to 50 wt % of the MDP3FL. The host material of the second light-emitting layer can be CBP, and the second dye may comprise Ir(piq)$_2$(acac), Ir(2-phq)$_3$, and Ir(ppy)$_3$, in which the content of the Ir(piq)$_2$(acac) is 0.01 to 10 wt % of the host material, a content of the Ir(2-phq)$_3$ is 0.01 to 10 wt % of the host material, and a content of the Ir(ppy)$_3$ is 0.01 to 10 wt % of the host material According to the OLED of the present invention, the material of the hole transport layer is not specially limited. Preferably, the material of the hole transport layer can be an aromatic tertiary amine having at least one carbon-bonded trivalence nitrogen and at least one aromatic ring. The aromatic tertiary amine can be an arylamine such as a monarylamine, a diarylamine, or a triarylamine. Also, the material of the electron transport layer is not specially limited, preferably is an oxinoid compound chelated with metal or an oxine chelates such as Alq$_3$.

According to the OLED of the present invention, the substrate can be a silicon-based substrate, a glass substrate, a quartz substrate, or a plastic substrate. The anode can be made of any transparent or opaque electrically conducting materials such as indium tin oxide (ITO).

Other objects, advantages, and novel features of the invention will become more apparent from the following detailed description when taken in conjunction with the accompanying drawings.

DETAILED DESCRIPTION OF THE PREFERRED EMBODIMENT

Hereinafter, the present invention will be described in further detail with reference to examples and comparative examples. It is to be understood, however, that these examples are illustrative only and the scope of the present invention is not limited thereto. The specific examples below are to be construed as merely illustrative, and not limitative of the remainder of the disclosure in any way whatsoever. Without further elaboration, it is believed that one skilled in the art can, based on the description herein, utilize the present invention to its fullest extent. All publications cited herein are hereby incorporated by reference in their entirety.

Figure 1:
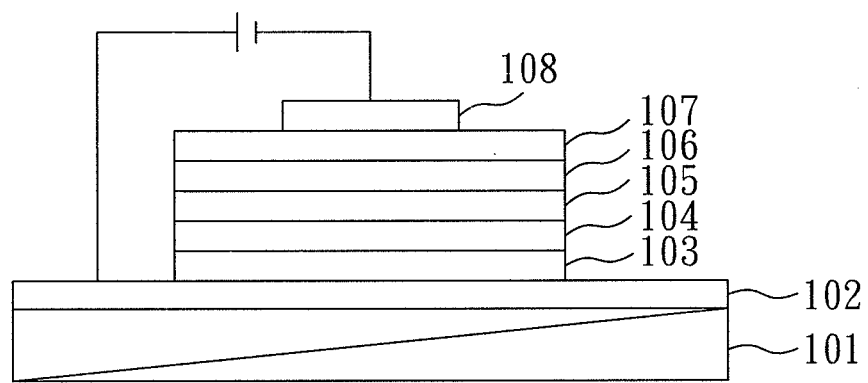
FIG. 1 is a schematic view showing a conventional OLED.
Figure 2:
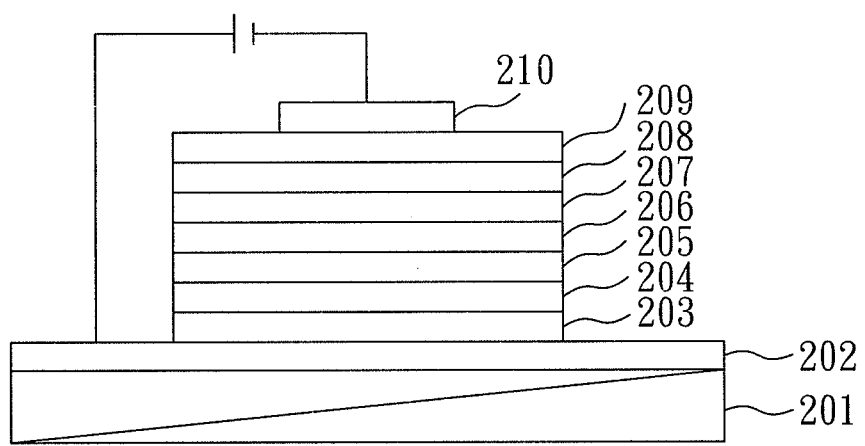
FIG. 2 is a schematic view showing the OLED of a preferred example of the present invention.

FIG. 2 is a schematic view showing the OLED of a preferred example of the present invention. The preferred example of the preparation of the OLED in the present invention is detailed illustrated below with reference to the FIG. 2.

Example 1

First, a substrate 201 is provided with a first electrode 202 formed thereon. Herein, the substrate 201 is a glass substrate and the first electrode 202 is an ITO anode having a thickness of 125 nm.

Then, a PEDOT:PSS polymer is coated on the first electrode 202 by spin coating to form a hole injection layer 203. After that, TAPC small molecules are vacuum evaporated to form a hole transport layer 204 on the hole injection layer 203. Herein, the hole transport layer 204 has a thickness of 10 nm.

MDP3FL as the deep blue dye and DSB as the azure dye are mixed in THF followed with vacuum drying to provide an evaporating source, which is then used to form a first light-emitting layer 205 on the hole transport layer 204, and therefore a first light-emitting region is provided. In the present example, the concentration of the DSB is 3 wt % of the MDP3FL, and the first light-emitting layer 205 has a thickness of 10 nm.

Then, a spacer 206 is formed on the first light-emitting layer 205. Herein, the spacer 206 has a thickness of 3 nm, and the spacer 206 is made of CBP.

Ir(piq)$_2$(acac) as the red dye, Ir(2-phq)$_3$ as the orange-red dye, Ir(ppy)$_3$ as the green dye, and CBP as the host material are mixed in THF followed with vacuum drying to provide an evaporating source, which is then used to form a second light-emitting layer 207 on the spacer 206, and therefore a second light-emitting region is provided. In the present example, the concentration of the Ir(piq)$_2$(acac) is 1 wt % of the host material, the concentration of the Ir(2-phq)$_3$ is 1 wt % of the host material, the concentration of the Ir(ppy)$_3$ is 3 wt % of the host material, and the second light-emitting layer 207 has a thickness of 3 nm.

Then, by vacuum evaporating, Bphen is evaporated on the second light-emitting layer 207 to form an electron transport layer 208 having a thickness of 15 nm. After that, Alq$_3$ is evaporated on the electron transport layer 208 to form an electron injection layer 209 having a thickness of 5 nm.

Finally, a second electrode 210 is formed on the electron injection layer 209, in which the second electrode 210 is a LiF/Al electrode.

Hence, an OLED of the present example is completed, which comprises: a substrate 201 with a first electrode 202 formed thereon; a first light-emitting layer 205 disposed over the first electrode 202, and the first light-emitting layer 205 comprises at least one first dye (a deep blue dyeMDP3FL and an azure dye DSB); a spacer 206 disposed on the first light-emitting layer 205; a second light-emitting layer 207 disposed on the spacer 206, and the second light-emitting layer 207 comprises at least one second dye (comprising Ir(piq)$_2$(acac) as the red dye, Ir(2-phq)$_3$ as the orange-red dye, and Ir(ppy)$_3$ as the green dye) and a host material (CBP); and a second electrode 210 disposed over the second light-emitting layer 207.

Meanwhile, the OLED of the present example further comprises: a hole transport layer 204 disposed on the first electrode 202, and the hole transport layer 204 is disposed between the first electrode 202 and the first light-emitting layer 205; a hole injection layer 203 disposed on the first electrode 202, and the hole injection layer 203 is disposed between the first electrode 202 and the hole transport layer 204; an electron transport layer 208 disposed on the second light-emitting layer 207, and the electron transport layer 208 is disposed between the second light-emitting layer 207 and the second electrode 210; and an electron injection layer 209 disposed on the electron transport layer 208, and the electron injection layer 209 is disposed between the electron transport layer 208 and the second electrode 210.

The OLED provided by the present example is tested by a 3.3V driving voltage test and can emit white light. With brightness of 100 cd/m$^2$, the luminescent efficiency is 4.9 lm/W; whereas with brightness of 1000 cd/m$^2$, the luminescent efficiency is 2.2 lm/W. Meanwhile, the obtained white light from the OLED of the present example has a CIE coordinate of (0.35, 0.38) and has a CRI value of 92.

Example 2

Except the spacer in the present example is made of TCTA, the OLED of the present example is provided by the same method as described in the Example 1.

The OLED provided by the present example is tested by a 3.5V driving voltage test and can emit white light. With brightness of 100 cd/m$^2$, the luminescent efficiency is 12.5 lm/W; whereas with brightness of 1000 cd/m$^2$, the luminescent efficiency is 7.5 lm/W. Meanwhile, the obtained white light from the OLED of the present example has a CIE coordinate of (0.43, 0.44) and has a CRI value of 94.

Example 3

Except plural first light-emitting layer and plural second light-emitting layers are formed to provide a first light-emitting region and a second light-emitting region respectively, the OLED of the present example is provided by the same method as described in the Example 1, in which the material of each of the first light-emitting layer 205 is the same, and the material of each of the second light-emitting layer 205 is the same.

The OLED of the present invention utilizes a spacer disposed between the two light-emitting regions, in which the energy level of the spacer is adjusted to locate between the energy levels of the two light-emitting regions, and therefore can obtain ideal power or current efficiency and excellent color rendering index (CRI) with uncomplicated structure that can be provided by simple process steps. Compared with conventional OLEDs, the OLED of the present invention has uncomplicated structure and can be easily produced with simple process, and at the same time the OLED of the present invention can provide white light with excellent color rendering index (CRI) and therefore is able to act for lighting usage to replace the commonly-used fluorescent lamp.

Although the present invention has been explained in relation to its preferred embodiment, it is to be understood that many other possible modifications and variations can be made without departing from the scope of the invention as hereinafter claimed.

What is claimed is:

1. An organic light-emitting diode, which comprises:
a substrate with a first electrode formed thereon;
a first light-emitting region disposed over the first electrode, wherein the first light-emitting region comprises at least one layer of a first light-emitting layer, the at least one first light-emitting layer comprises at least one first dye, and the first dye is a fluorescent dye, a phosphorescence dye, or a mixture thereof;
a spacer disposed on the first light-emitting region;
a second light-emitting region disposed on the spacer, wherein the second light-emitting region comprises at least one layer of a second light-emitting layer, the at least one second light-emitting layer comprises at least one second dye, and the second dye comprises Ir(piq)$_2$(acac), Ir(2-phq)$_3$, and Ir(ppy)$_3$, and the second light-emitting layer further comprises a host material, in which a content of the Ir(piq)$_2$(acac) is 0.01 to 10 wt % of the host material, a content of the Ir(2-phq)$_3$ is 0.01 to 10 wt % of the host material, and a content of the Ir(ppy)$_3$ is 0.01 to 10 wt % of the host material; and
a second electrode disposed over the second light-emitting region,
wherein the spacer is made of a material with a HOMO and LUMO energy levels between those of the first light-emitting region and the second light-emitting region respectively.

2. The organic light-emitting diode as claimed in claim 1, wherein the first light-emitting region comprises one to four layers of the first light-emitting layer.

3. The organic light-emitting diode as claimed in claim 1, wherein the second light-emitting region comprises one to four layers of the second light-emitting layer.

4. The organic light-emitting diode as claimed in claim 1, wherein the spacer is made of a host material or a fluorescent dye.

5. The organic light-emitting diode as claimed in claim 1, wherein the spacer is made of: TCTA, CBP, 4P-NPD, TPBi, Alq$_3$, or a mixture thereof.

6. The organic light-emitting diode as claimed in claim 1, wherein the first light-emitting layer further comprises a host material.

7. The organic light-emitting diode as claimed in claim 1, wherein the second light-emitting layer further comprises a host material.

8. The organic light-emitting diode as claimed in claim 1, wherein the first dye is a fluorescent dye.

9. The organic light-emitting diode as claimed in claim 1, wherein the first dye comprises MDP3FL and DSB, and a content of the DSB is 0.01 to 50 wt % of the MDP3FL.

10. The organic light-emitting diode as claimed in claim 1, further comprises: a hole transport layer disposed between the first electrode and the first light-emitting region; a hole injection layer disposed between the first electrode and the first light-emitting region; or a hole injection layer and a hole transport layer disposed sequentially on the first electrode, wherein the hole injection layer and the hole transport layer are disposed between the first electrode and the first light-emitting region.

11. The organic light-emitting diode as claimed in claim 1, further comprises: an electron transport layer disposed between the second light-emitting region and the second electrode; an electron injection layer disposed between the second light-emitting region and the second electrode; or an electron transport layer and an electron injection layer disposed sequentially on the second light-emitting region, wherein the electron transport layer and the electron injection layer are disposed between the second light-emitting region and the second electrode.

12. The organic light-emitting diode as claimed in claim 1, wherein the spacer is made of a material with a hole mobility of $2\times10^{-3}$ to $6\times10^{-8}$ $cm^2V^{-1}S^{-1}$, and an electron mobility of the material of the spacer is $2\times10^{-3}$ to $6\times10^{-8}$ $cm^2V^{-1}S^{-1}$ under an electric field of $3.6\times10^{-5}$ $Vcm^{-1}$.

13. The organic light-emitting diode as claimed in claim 1, wherein the first dye is a blue dye.

* * * * *